US007277156B2

(12) United States Patent
Jung

(10) Patent No.: US 7,277,156 B2
(45) Date of Patent: Oct. 2, 2007

(54) SCANNER APPARATUS WITH TWIN SUBSTRATE STAGE, SEMICONDUCTOR PHOTO EQUIPMENT WITH THE APPARATUS AND METHOD OF MANUFACTURING A SEMICONDUCTOR DEVICE USING THE EQUIPMENT

(75) Inventor: Joo-sung Jung, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 11 days.

(21) Appl. No.: 11/265,117

(22) Filed: Nov. 3, 2005

(65) Prior Publication Data

US 2006/0139591 A1 Jun. 29, 2006

(30) Foreign Application Priority Data

Dec. 27, 2004 (KR) ..................... 10-2004-0112901

(51) Int. Cl.

*G03B 27/42* (2006.01)
*G03B 27/52* (2006.01)
*G03B 27/54* (2006.01)
*G03B 27/62* (2006.01)

(52) U.S. Cl. ........................... 355/53; 533/55; 533/67; 533/75

(58) Field of Classification Search ................. 355/53, 355/67

See application file for complete search history.

(56) References Cited

U.S. PATENT DOCUMENTS

| | | | | |
|---|---|---|---|---|
| 5,929,976 | A * | 7/1999 | Shibuya et al. | 355/53 |
| 2003/0203295 | A1* | 10/2003 | Kim et al. | 430/22 |
| 2004/0004700 | A1* | 1/2004 | Park et al. | 355/53 |
| 2004/0130691 | A1* | 7/2004 | Boonman et al. | 355/53 |

FOREIGN PATENT DOCUMENTS

| | | |
|---|---|---|
| JP | 07-142373 | 6/1995 |
| KR | 1999-0031795 | 5/1999 |
| KR | 10-2000-0066105 | 11/2000 |
| KR | 10-2003-0002323 | 1/2003 |

* cited by examiner

*Primary Examiner*—Peter B. Kim
*Assistant Examiner*—Marissa A. Ohira
(74) *Attorney, Agent, or Firm*—Lee & Morse, P.C.

(57) ABSTRACT

A scanner apparatus includes an exposure unit and an alignment unit, wherein the alignment unit includes an aligning/leveling apparatus for performing global aligning and leveling processes for a wafer in the alignment unit and an edge exposure apparatus, receiving light from a light source, for performing an edge exposure process for the wafer in the alignment unit.

19 Claims, 5 Drawing Sheets

200
260
R
296
294
292
275
273
272
230
252b
252a
242b
244b
242a
244a
W2
W1
220b
224b
222b
224a
222a
220a
210
270

SCANNER APPARATUS WITH TWIN SUBSTRATE STAGE, SEMICONDUCTOR PHOTO EQUIPMENT WITH THE APPARATUS AND METHOD OF MANUFACTURING A SEMICONDUCTOR DEVICE USING THE EQUIPMENT

BACKGROUND OF THE INVENTION

1. Field of the Invention

The present invention relates to a semiconductor manufacturing apparatus and a method of manufacturing a semiconductor device using the same. More particularly, the present invention relates to a scanner apparatus with a twin substrate stage, semiconductor photo equipment including the apparatus and a method of manufacturing a semiconductor device using the same.

2. Description of the Related Art

In the art of semiconductor manufacturing, an early semiconductor exposure apparatus was a proximity exposure apparatus. The proximity exposure apparatus gave way to a stepper apparatus, which, in turn, gave way to a scanner apparatus in the latter half of the 1990s. The scanner apparatus typically performs the exposure process by scanning light passing through a slit. The scanner apparatus has an advantage over the stepper apparatus in that a size of the projection lens may be reduced. The scanner apparatus may also average an error in the scanning direction arising from distortion or mislocation of the reticle. Accordingly, the scanner apparatus has been widely adopted for high-resolution exposure equipment.

FIG. 1 illustrates a block diagram of semiconductor photo equipment having a conventional scanner including a spinner apparatus 20 and a scanner apparatus 100. The spinner apparatus 20 and the scanner apparatus 100 are arranged to be inline. The spinner apparatus 20 performs photo resist deposition, baking and developing processes. The spinner apparatus 20 includes an edge exposure wafer (EEW) unit 25 that performs an edge exposure process for an edge of a wafer. A loading/unloading unit 10 for loading and unloading a cassette in which wafers are loaded is positioned on a side of the spinner apparatus 20. An interface unit 30 is disposed between the spinner apparatus 20 and the scanner apparatus 100.

FIG. 2 illustrates a sectional view of the scanner apparatus 100 of FIG. 1. Referring to FIG. 2, the scanner apparatus 100 includes twin substrate stages 120*a* and 120*b* installed on a base frame 110. Substrate stage 120*a* is a measuring stage and substrate stage 120*b* is an exposure stage. The measuring stage 120*a* includes a first chuck support 122*a* and a measuring chuck 124*a*. The exposure stage 120*b* includes a second chuck support 122*b* and an exposure chuck 124*b*. Metro frame 130 is installed above the respective substrate stages 120*a* and 120*b*. Light emission parts 142*a* and 142*b* and light absorption parts 144*a* and 144*b* that perform aligning and leveling processes are installed under the portion of the metro frame 130 disposed above the measuring stage 120*a*. A projection lens 160 and a reticle R and auto-focusing units 152*a* and 152*b* for performing the exposure process are respectively installed above and below the portion of the metro frame 130 disposed above the exposure stage 120*b*. Light for the exposure process is directed from a light source 170, e.g., a KrF or ArF excimer laser, which may be remote from the scanner apparatus. An arrow indicates a light path from the light source 170 to the projection lens 160.

A semiconductor photo process will now be described with reference to FIGS. 1 and 2. After a wafer W1 is loaded from the loading/unloading unit 10 to the spinner apparatus 20, a conventional photoresist coating process is performed. After the wafer W1 is transferred to the scanner apparatus 100 via the interface unit 30, the wafer W1 is loaded in a pre-alignment unit (not shown) to be aligned in a predetermined orientation. Next, the wafer W1 is conveyed to the alignment unit of the scanner apparatus 100 and loaded in the measuring stage 120*a*, after which the global aligning and leveling processes for the wafer W1 are performed.

After the above, the wafer W1 is conveyed to the exposure unit of the scanner apparatus 100 and loaded in the exposure substrate stage 120*b*. At the same time, a wafer W2 may be loaded in the measuring substrate stage 120*a*. In the exposure substrate stage 120*b*, an exposure process is performed by repeating step and scanning operations for the wafer W1. Concurrently, in the alignment unit, the global aligning and leveling processes may be performed for the wafer W2. Since the time for performing the global aligning and leveling processes in the alignment unit may be about 60% of the time for performing the exposure process in the exposure unit, the wafer W2, which has completed the global aligning and leveling processes, may need to wait to enter the next stage in order to perform the consecutive processes for multiple wafers.

When the exposure process for the wafer W1 is completed in the measuring stage 120*a*, the first W1 is transferred from the scanner apparatus 100 to the EEW unit 25 to go through an edge exposure process, after which the developing process for the wafer W1 may be performed by the spinner apparatus 20. When the developing process is completed, the wafer W1 is conveyed out of the semiconductor photo equipment by the loading/unloading unit 10.

In the process described above, the edge exposure is performed in the EEW unit 25 of the spinner apparatus 20, and thus the accuracy and precision of the process may be less than ideal, e.g., because a profile of the photo resist pattern may not be vertically formed. That is, since there is no precise exposure unit in the spinning apparatus, the accuracy and precision of the edge exposure process may be less than ideal. If the pattern is not too small, or if the size of the wafer is small, the precision and accuracy may not be a significant problem in the exposure process for the wafer edge. However, as the exposure pattern of the semiconductor wafer becomes increasingly small and the size of the wafer continues to grow, e.g., currently up to 12 inches, there is a need to enhance the accuracy and precision of the wafer edge exposure process. Furthermore, since the wafer edge exposure process is additionally performed in the EEW unit 25, the whole processing time of the semiconductor photo process is increased, thereby reducing productivity and yield.

The edge exposure process may have other deficiencies as well as those just described. A reticle having a shot area corresponding to 6 chips, 8 chips or 12 chips may be used in a main exposure process performed in the exposure unit. However, it may not be possible to use this same reticle for the edge exposure process. For example, in the conventional semiconductor manufacturing process illustrated FIG. 3A, a reticle R1 having a 6-chip shot area may be used to perform the exposure process for a center portion of the wafer as well as a portion contiguous to an edge of the wafer. The exposure result is illustrated in FIG. 3B, in which a shaded portion indicates a light reception region. As illustrated, the exposure process for the portion contiguous to the edge of the wafer, as well as the center portion of the wafer, is performed using the reticle R1 having the 6-chip shot area.

However, when forming deep features, e.g., in the case of a storage polysilicon process for forming a storage node of a One Cylinder Storage (OCS) structure, it may not be possible to perform the exposure process using the reticle R1 because the shot area may overlap the edge portion of the wafer. Where an OCS structure having a cylindrical pattern 15,000 Å or more in height is formed in the storage polysilicon process, severe particle generation may occur during the exposure process. In order to solve this problem, a reticle R2, illustrated in FIG. 4A, having a shot area that is less than the shot area of the reticle R1, may be used to perform the exposure process. FIG. 4B illustrates a plan view of a front surface of a wafer exposed through an exposure process using the reticle illustrated in FIG. 4A. Using this "page shot" exposure process, the shot area does not overlap the edge portion of the wafer and is located, instead, inside the border—even when the exposure process is performed for dies located on the wafer edge portion. However, the page shot process increases the number of shots required for exposing the whole surface of the wafer, thereby increasing the exposure processing time, reducing productivity and increasing processing costs.

SUMMARY OF THE INVENTION

The present invention is therefore directed to a scanner apparatus with a twin substrate stage, semiconductor photo equipment including the apparatus and a method of manufacturing a semiconductor device using the same which substantially overcome one or more of the problems due to the limitations and disadvantages of the related art.

It is therefore a feature of an embodiment of the present invention to provide a scanner apparatus capable of performing a wafer edge exposure process in an alignment unit of the scanner apparatus.

It is therefore another feature of an embodiment of the present invention to provide semiconductor photo equipment including the scanner apparatus of the present invention, wherein there is no need to provide a special edge exposure wafer unit for the spinner apparatus.

It is therefore a further feature of an embodiment of the present invention to provide semiconductor photo equipment having improved throughput, wherein an edge exposure process may be performed in the scanner apparatus.

It is therefore yet another feature of an embodiment of the present invention to provide a scanner apparatus that can improve the accuracy and precision of an exposure process as well as productivity by reducing the time for performing a semiconductor photo process.

It is therefore also a feature of an embodiment of the present invention to provide a scanner apparatus that may reduce an exposure processing time and improve productivity by using a reticle having a shot area identical to that of an exposure process for other layers, and without using a reticle divided into a smaller shot area, even when an exposure process for a layer having a deep pattern, e.g., an OCS polysilicon layer, is performed.

At least one of the above and other features and advantages of the present invention may be realized by providing a scanner apparatus having an exposure unit and an alignment unit, wherein the alignment unit includes an aligning/leveling apparatus for performing global aligning and leveling processes for a wafer in the alignment unit and an edge exposure apparatus, receiving light from a light source, for performing an edge exposure process for the wafer in the alignment unit.

The edge exposure apparatus may further include an alignment unit projection lens for projecting light onto the wafer from the light source and a light intensity control unit disposed between the light and the wafer, the light intensity control unit for controlling an intensity of the projected light on the wafer. The scanner apparatus may also include an exposure unit projection lens, wherein the alignment unit projection lens, the light intensity control unit and the exposure unit projection lens are fixed to a metro frame. The light source may be a common single light source to provide light to the exposure unit and the alignment unit. The scanner apparatus may also include a light splitter for splitting the light from the light source, the light splitter directing a first portion of the light to the alignment unit via a first light path and directing a second portion of the light to the exposure unit via a second light path and a beam damper disposed in the first light path. The scanner apparatus may also include a controller controlling at least one of the beam damper and the light splitter. The controller may control the beam damper such that light is provided in the first light path when light is not output from the light source. The controller may control the light splitter to adjust intensities in the first and second portions of the light. The beam damper may be integrated in the light splitter. The scanner apparatus may also include an alignment unit light source.

At least one of the above and other features and advantages of the present invention may also be realized by providing a semiconductor photo equipment including a spinner apparatus and a scanner apparatus arranged inline, wherein the scanner apparatus includes an exposure unit having an exposure substrate stage and an alignment unit having an alignment substrate stage, wherein the alignment unit includes an aligning/leveling apparatus for performing global aligning and leveling processes for a wafer installed on the alignment substrate stage, and an edge exposure apparatus receiving light from a light source and for performing an edge exposure process for the wafer.

The edge exposure apparatus may further include a light intensity control unit for controlling an intensity of light projected onto the wafer and a projection lens for projecting the light passing through the light intensity control unit onto the wafer. The semiconductor photo equipment may further include a common single light source to provide light to the exposure unit and the alignment unit. The spinner apparatus may not include a wafer edge exposure unit.

At least one of the above and other features and advantages of the present invention may further be realized by providing a semiconductor manufacturing method using a semiconductor photo equipment having a scanner apparatus and a spinner apparatus arranged to be inline with the scanner apparatus, the scanner apparatus including an alignment unit and an exposure unit, the method including performing aligning and leveling processes for a wafer in the alignment unit, performing an wafer edge exposure process for the wafer in the alignment unit and performing a main exposure process for the wafer in the exposure unit.

The main exposure process for the wafer may be performed after the edge exposure process for the wafer. The semiconductor manufacturing method may further include performing the main exposure process for a second wafer in the exposure unit while performing the edge exposure process for the wafer in the alignment unit and may include performing the edge exposure process for the wafer during a step process of the main exposure process for the second wafer. The method may be applied to an OCS-type polysilicon storage node process and the edge exposure process and the main exposure process may be performed using light from a common light source.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF THE INVENTION

Korean Patent Application No. 10-2004-0112901, filed on Dec. 27, 2004, in the Korean Intellectual Property Office, and entitled: "Scanner Apparatus with Twin Substrate Stage, Semiconductor Photo Equipment with the Apparatus and Manufacturing Method of Semiconductor Device using the Equipment," is incorporated by reference herein in its entirety.

The present invention will now be described more fully hereinafter with reference to the accompanying drawings, in which exemplary embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the figures, the dimensions of layers and regions are exaggerated for clarity of illustration.

Figure 1:
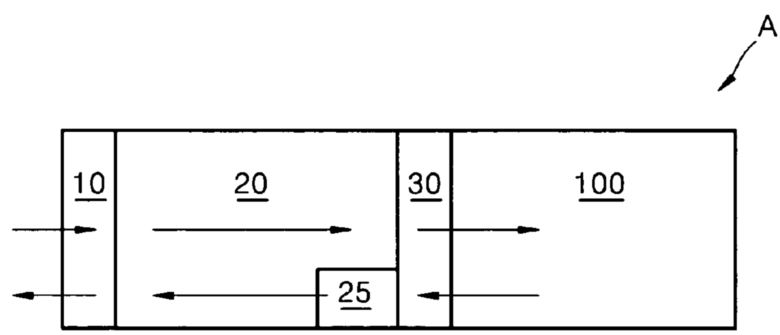
FIG. 1 illustrates a block diagram of conventional semiconductor photo equipment including a scanner apparatus with a twin substrate stage.
Figure 2:
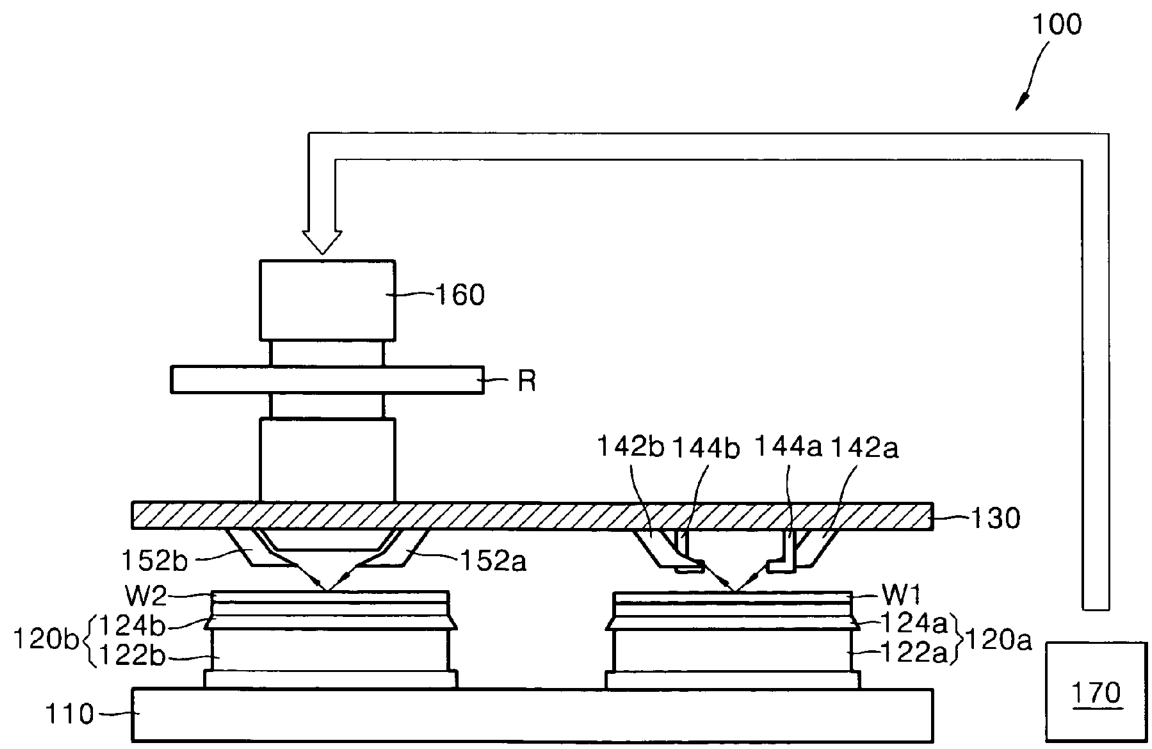
FIG. 2 illustrates a sectional view of the scanner apparatus of FIG. 1.
Figure 5:
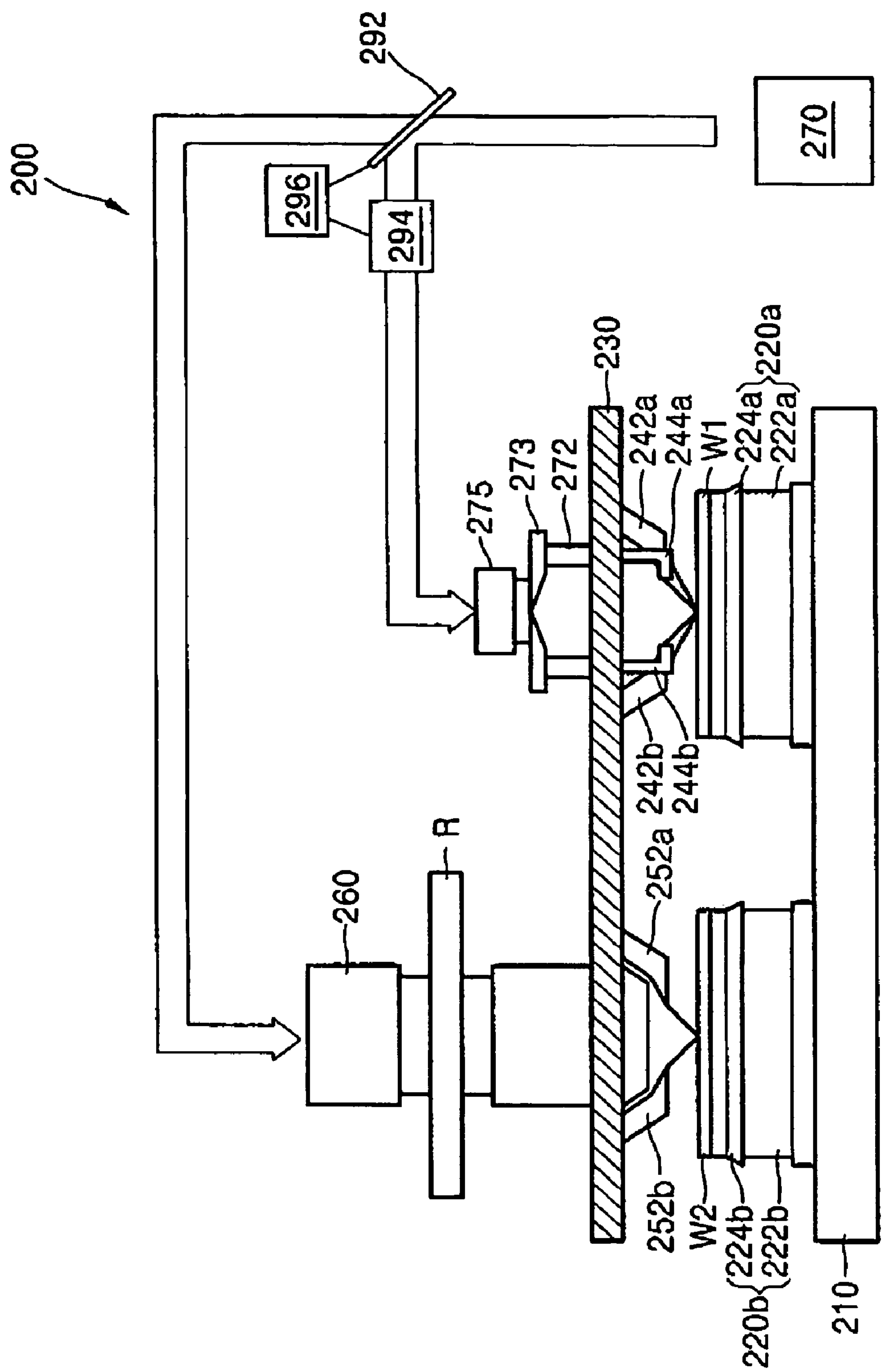
FIG. 5 illustrates a schematic view of a scanner apparatus of semiconductor photo equipment according to an embodiment of the present invention.

FIG. 5 illustrates a schematic view of a scanner apparatus 200 according to an embodiment of the present invention. The scanner apparatus 200 substantially overcomes one or more of the problems due to the limitations and disadvantages of the related art. The scanner apparatus 200 may be used in conjunction with the spinner apparatus 20 in, e.g., an inline arrangement, in semiconductor photo equipment. The spinner apparatus 20 may be a conventional spinner apparatus without the EEW 25 as shown in FIG. 1. The scanner apparatus 200 will now be described in detail.

Referring to FIG. 5, the scanner apparatus 200 may include an alignment substrate stage 220*a* and an exposure substrate stage 220*b*. The alignment substrate stage 220*a* and the exposure substrate stage 220*b* may be disposed on a base frame 210. The alignment and exposure substrate stages 220*a* and 220*b* may include respective chucking units 224*a* and 224*b*, e.g., electrostatic chucks, and respective supports 222*a* and 222*b*. The detailed structures and operations of the alignment and exposure substrate stages 220*a* and 220*b* may be varied according to the type of the scanner apparatus 200. That is, the structures of the alignment and exposure substrate stages 220*a* and 220*b* are not limited to those illustrated in FIG. 5.

A variety of components, including the exposure substrate stage 220*b*, may make up an exposure unit of the scanner apparatus 200 and may be arranged as illustrated in FIG. 5. The exposure unit may include a light source 270, e.g., a KrF or ArF excimer laser, a variety of filters and lenses (not shown) arranged along a light path, and a projection lens 260 for projecting light from the source 270 onto a wafer W2. An exposure process may be performed when the wafer W2 is loaded on the exposure substrate stage 220*b*. The exposure process may include repeated stepping and scanning, during which light, e.g., the excimer laser light, is provided during the scan and is not provided during the step.

Projection lens 260 may be fixedly attached to a metro frame 230. The metro frame 230 may function as a fixing member in the scanner apparatus 200 to enhance the precision of the exposure and alignment. That is, the metro frame 230 may function to securely fix members used for the exposure and alignment processes, thereby enhancing the precision thereof.

A pair of auto-focusing members 252*a* and 252*b* may be fixedly installed on the metro frame 230 to be contiguous to the projection lens 260. One of the auto-focusing members, e.g., 252*a*, may be a light emission part and the other, e.g., 252*b*, may be a light reception part, and may function to accurately focus a laser in the exposure process.

A variety of components, including the alignment substrate stage 220*a*, may make up an alignment unit of the scanner apparatus 200 and may be arranged as illustrated in FIG. 5. The alignment unit may perform global aligning and leveling processes and may include light emission and light absorption units 242*a* and 242*b* and leveling units 244*a* and 244*b*. As illustrated, the alignment units 242*a* and 242*b* and the leveling units 244*a* and 244*b* may be fixedly installed on the metro frame 230.

The alignment unit of the scanner apparatus 200 may further include components for performing a wafer edge exposure process, in contrast to the conventional approach wherein the separate EEW unit 25 in the spinner apparatus 20 is required. The wafer edge exposure components may include, e.g., a beam splitter 292, a beam damper or an optical buffer 294, a projection lens 275, an optical shutter 273 and a controller 296 controlling the operation of the beam damper or buffer 294 and/or the beam splitter 292.

The beam splitter 292 may function to direct some light from the light source 270 to a first path directed toward the alignment substrate stage 220*a* and to direct some light from the light source 270 to a second path directed toward the exposure substrate stage 220*b*.

The beam damper or the optical buffer 294 may function to control a transmission method and/or timing of the light being directed to the first path to the alignment substrate stage 220*a*. Thus, for example, an excimer laser light source 270, e.g., a KrF or ArF source, may be excited only when the scanning process occurs in the exposure unit. Further, the timing for performing the wafer edge exposure process in the alignment unit need not be identical to that for performing the scanning process in the exposure unit. The beam damper or optical buffer 294 may control the transmission method and/or timing of light to be transmitted through the first path, thereby compensating for a timing difference between the light directed to the substrate stages 220_a_ and 220_b_.

The optical shutter 273 may control the intensity and/or shape of the light projected to the wafer W1. The optical shutter 273 may be fixed on the metro frame 230 by a supporting member 272. The structure of the optical shutter 273 is not limited to a specific type, and a conventional optical shutter may be used. Light passing through the optical shutter 273 may be projected on the wafer W1 via the projection lens 275.

The operation of the scanner apparatus 200 illustrated in FIG. 5 will now be described in detail. First, the wafer W1 may be loaded on the alignment substrate stage 220_a_ and the wafer W2 may be loaded on the exposure substrate stage 220_b_. The wafer W2 may have already gone through alignment and wafer edge exposure processes by being loaded on the alignment substrate stage 220_a_. The main exposure process may occur in the exposure unit, during which the focus is first adjusted using the auto-focusing units 252_a_ and 252_b_ and a scanning process is performed for a predetermined region of the wafer W2.

In the scanning process, light may be directed onto the wafer W2 through the second path, after which the step processing is performed to prepare the main exposure process for another region of the wafer W2. In the step process, light need not be transmitted through the second path. That is, the light source 270 need not be activated. Accordingly, the light source 270 may be controlled such that the light is only provided when the scanning process for a predetermined region of the wafer W2 occurs in the exposure unit. The scanning and step processes may be repeatedly performed in the exposure unit, thereby completing the main exposure process for the front surface of the wafer W2.

At the same time wafer W2 is being processed by the main exposure process in the exposure unit, the global aligning and leveling processes for the wafer W1 may be performed. The wafer W1 may have already gone through a pre-aligning process. The global aligning and leveling processes may be conventional processes, and the period of time needed to perform the aligning and leveling processes may be shorter than that needed for performing the main exposure process. Since the two periods may not be equal, there may be a need for a delay after the aligning and leveling processes are completed for the wafer W1 before transferring the wafer W1 to the exposure unit.

In the scanner apparatus 200 according to an embodiment of the present invention, the wafer edge exposure process may be performed in the alignment unit during the delay. That is, the wafer edge exposure process may be performed in the alignment unit during the period of time required for performing the exposure process in the exposure unit. This is in contrast to the conventional approach used in the system illustrated in FIG. 1, wherein the wafer edge exposure process is performed in the EEW unit 25 of the spinner apparatus 20, i.e., after the exposure process.

In this embodiment of the present invention, in the course of performing the wafer edge exposure process, light may be projected onto an edge portion of the wafer W1 through the first path. For example, the light source 270, which may include a KrF excimer laser, may be activated when the scanning process occurs in the exposure unit and the light may be directed to the beam splitter 292 via a variety of optical units. The light may be split by the beam splitter so that a portion of the light is directed to the wafer W2 on the exposure substrate stage 220_b_ along the second path while another portion of the light follows the first path and is directed onto the wafer W1 on the alignment substrate stage 220_a_.

During the step process in the exposure unit of the scanning apparatus, light is not used. Thus, light may only need to be intermittently projected to the wafer W2. However, when the wafer edge exposure process occurs in the alignment unit, light may be required for the wafer Wi. In the scanner apparatus 200 of an embodiment of the present invention, the controller 296 may be provided. The controller 296 may control the state of the beam splitter 292 such that all light may be directed into the first path when only the wafer edge exposure process is occurring in the alignment unit, i.e., during the step process, while all of the light may be directed into the second path during the scanning process. In other words, the wafer edge exposure process may be sequential to the scanning process, rather than simultaneous with it.

The controller 296 may further control the beam damper or optical buffer 294. The beam splitter 292 and/or the beam damper or optical buffer 294 can be individually or integrally controlled by the controller 296. The controller may also be employed when light is to be directed to both the first and second paths, to adjust the respective intensities in the light paths and/or to control the beam damper or optical buffer 294. When the wafer edge exposure process is sequential to the scanning process, the beam splitter 292 may be a simple reflector and the controller 296 may move the beam splitter 292 into and out of the light path.

The light source 270 may include more than one light emitter, e.g., a separate light emitter for use with each of the exposure unit and alignment unit. When light is to be applied simultaneously to the wafers W1 and W2, the beam damper or optical buffer 294 may deliver light to the wafer W2 even when its corresponding emitter is not outputting light. When light is to be applied sequentially to the wafers W1 and W2, only the respective emitters may be correspondingly activated. Alternatively, the beam splitter 292 may include a filter for transmitting light from the separate light emitters to the appropriate paths.

As described above, when the scanner apparatus according to the present invention is used, since the wafer edge exposure process is performed in the alignment unit, there is no need to install the conventional EEW unit 25 in the spinner apparatus 20 (FIG. 1). Therefore, the structure of the spinner apparatus can be simplified and, since another process unit can be installed instead of the EEW unit, the productivity of the unit process in the spinner apparatus may be improved.

In addition, according to the present invention, the wafer edge exposure process may be performed in the scanner apparatus. The scanner apparatus may be a very complicated, expensive apparatus designed to perform the main exposure process. Accordingly, in the present invention, since the wafer edge exposure process may be performed in the scanner apparatus, the accuracy and precision of the wafer edge process may be improved over the conventional art, wherein the wafer edge exposure process is performed in the spinner apparatus, after the main exposure process.

In an embodiment of the present invention, the wafer edge exposure process may be performed in the alignment unit before the main exposure process is performed in the exposure unit, which may allow for a more precise execution of this process. This will be described in more detail with reference to FIG. 6, which illustrates an enlarged view of a wafer edge for an exposure process.

Figure 6:
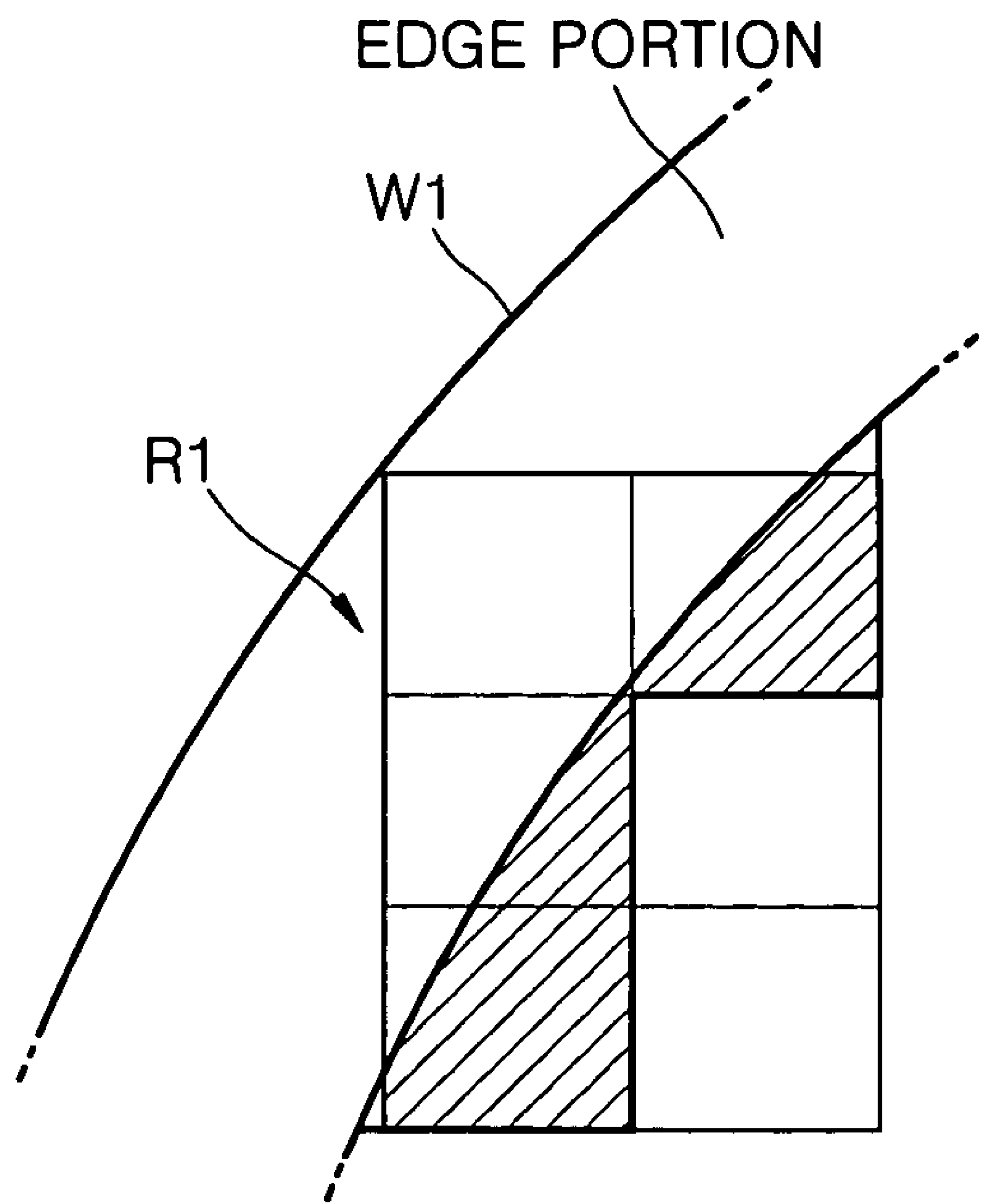
FIG. 6 illustrates an enlarged view of a wafer edge for an exposure process according to an embodiment of the present invention.

In this embodiment of the present invention, when the wafer edge exposure process is performed in the alignment unit before the scanning process, the exposure may proceed in a circular fashion, following a border of the edge portion and step and scanning methods following border surfaces of an oblique line portion in FIG. 6, as a result of which the wafer edge exposure process can be more precisely performed.

Figure 3A:
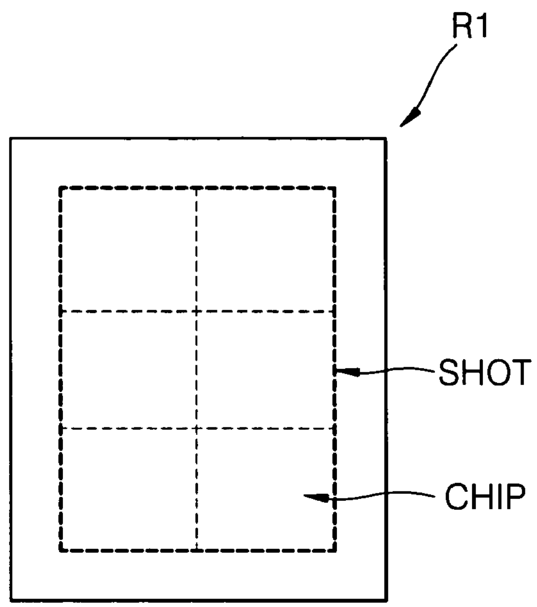
FIG. 3A illustrates a view of a reticle used for an exposure process for a plurality of chips using a single shot.
Figure 3B:
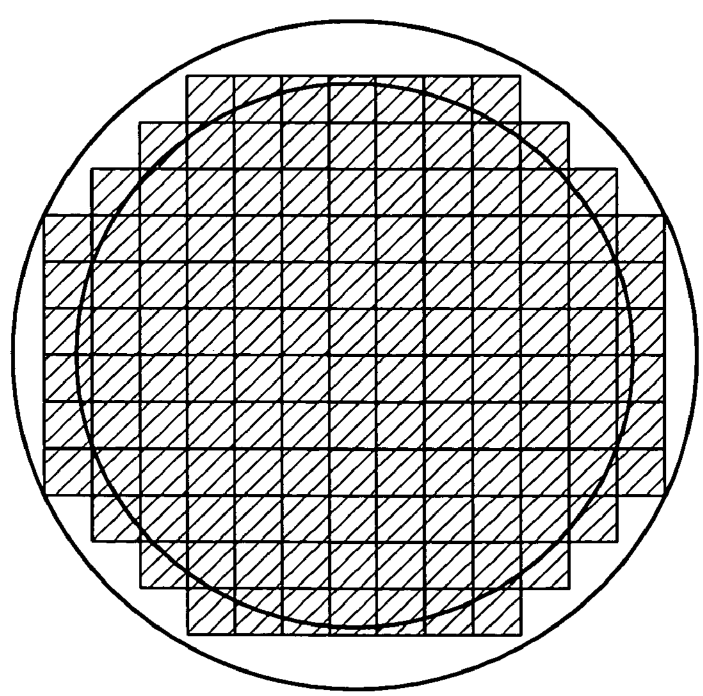
FIG. 3B illustrates a plan view of a front surface of a wafer, which is exposed through an exposure process using the reticle illustrated in FIG. 3A.
Figure 4A:
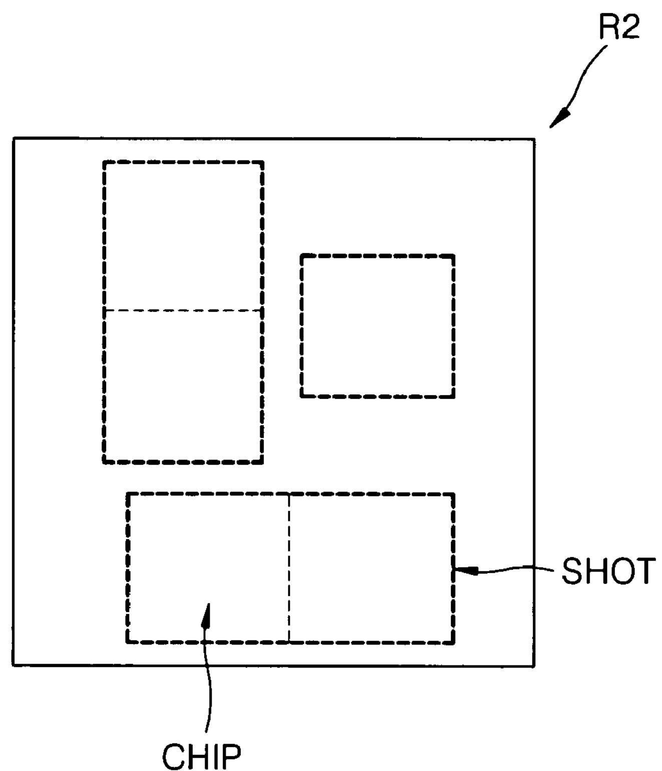
FIG. 4A illustrates a view of a reticle used for an exposure process using a page shot.
Figure 4B:
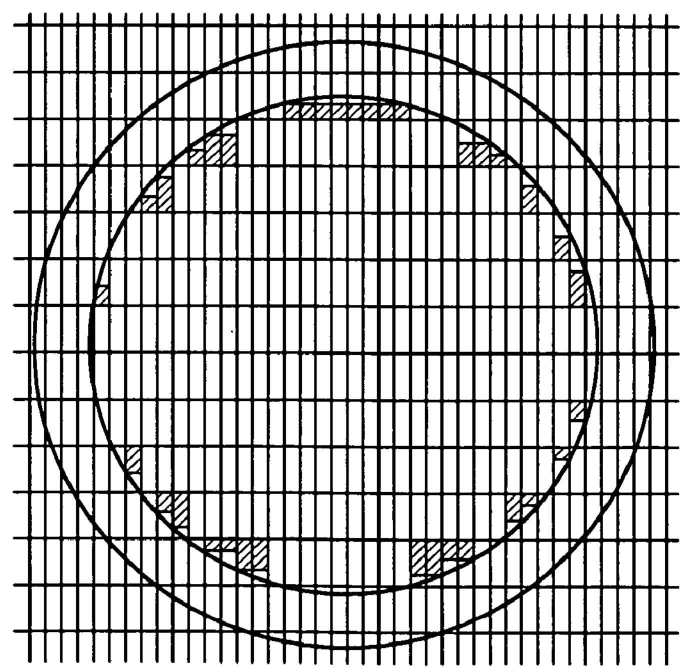
FIG. 4B illustrates a plan view of a front surface of a wafer, which is exposed through an exposure process using the reticle illustrated in FIG. 4A.

As described above, when the wafer edge exposure process is performed using the scanner apparatus of the present invention, there is no need to use the page shot, unlike, e.g., the conventional OCS-type storage manufacturing process. That is, when the scanner apparatus in accordance with the present invention is used, since the wafer edge exposure may be performed in advance of the step and scanning methods, it is possible, even in the storage polysilicon forming process, to perform the main exposure process for the front surface of the wafer in the exposure unit using the reticle R1 illustrated in FIG. 3A in the method illustrated in connection with FIG. 3B. As a result, the number of shots may be reduced, thereby improving productivity and reducing processing time.

As described above, in semiconductor photo equipment including the scanner apparatus of the present invention, there is no need to provide a special EEW unit for the spinner apparatus. The wafer edge exposure process may be performed in the scanner apparatus of the present invention after the aligning and leveling processes are finished. Thus, when the semiconductor photo equipment according to the present invention is used, a photo resist layer coating process, wafer aligning and leveling processes, a wafer edge exposure process, a main wafer exposure process and a developing process may be performed in the stated order.

Further, the wafer edge exposure process may be performed in the alignment unit of the scanner apparatus. As a result, the accuracy and precision of the wafer edge exposure process may be improved relative to the conventional case, wherein the spinner apparatus is used. In addition, since it may be possible to perform the wafer edge exposure process in advance using the step and scanning methods, it may be possible to use a reticle having a shot area identical to that used for other processes—even, e.g., in a main exposure process of the OCS-type polysilicon storage node forming process. Thus, there is no need to use a page shot having a reticle with smaller divisions. Therefore, the number of shots can be reduced and the productivity can be improved.

Furthermore, with semiconductor photo equipment including the scanner apparatus of the present invention, a special EEW unit is not required. Thus, another unit can be installed in the spinner apparatus, thereby simplifying the spinner apparatus and/or improving throughput.

In addition, when the semiconductor photo process is performed using the semiconductor photo equipment including the scanner apparatus of the present invention, since it may be possible to utilize the delay after the aligning and leveling processes are finished, the utilization of the semiconductor photo equipment may be increased, thereby improving productivity.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A scanner apparatus having an exposure unit and an alignment unit, wherein the alignment unit comprises:

an aligning/leveling apparatus for performing global aligning and leveling processes for a wafer on an alignment substrate stage in the alignment unit; and an edge exposure apparatus, receiving light from a light source, for performing an edge exposure process for the wafer on the alignment substrate stage in the alignment unit, wherein the aligning/leveling apparatus and the edge exposure apparatus are stacked vertically on opposite sides of a metro frame on the alignment substrate stage so as to perform the global aligning and leveling processes and the edge exposure process without moving the wafer on the alignment substrate stage.

2. The scanner apparatus as claimed in claim 1, wherein the edge exposure apparatus further comprises:

an alignment unit projection lens for projecting light onto the wafer from the light source; and a light intensity control unit disposed between the light and the wafer, the light intensity control unit for controlling an intensity of the projected light on the wafer.

3. The scanner apparatus as claimed in claim 2, further comprising an exposure unit projection lens, wherein the alignment unit projection lens, the light intensity control unit and the exposure unit projection lens are fixed to the metro frame.

4. The scanner apparatus as claimed in claim 1, wherein the light source is a common single light source to provide light to the exposure unit and the alignment unit.

5. The scanner apparatus as claimed in claim 1, further comprising:

a light splitter for splitting the light from the light source, the light splitter directing a first portion of the light to the alignment unit via a first light path and directing a second portion of the light to the exposure unit via a second light path; and a beam damper disposed in the first light path.

6. The scanner apparatus as claimed in claim 5, further comprising a controller controlling at least one of the beam damper and the light splitter.

7. The scanner apparatus as claimed in claim 6, wherein the controller controls the beam damper such that light is provided in the first light path when light is not output from the light source.

8. The scanner apparatus as claimed in claim 6, wherein the controller controls the light splitter to adjust intensities in the first and second portions of the light.

9. The scanner apparatus as claimed in claim 5, wherein the beam damper is integrated in the light splitter.

10. A semiconductor photo equipment comprising:

a spinner apparatus and a scanner apparatus arranged inline, wherein the scanner apparatus includes:

an exposure unit having an exposure substrate stage and an alignment unit having an alignment substrate stage, wherein the alignment unit includes:

an aligning/leveling apparatus for performing global aligning and leveling processes for a wafer on an alignment substrate stage installed on the alignment substrate stage; and an edge exposure apparatus receiving light from a light source, for performing an edge exposure process for the wafer on the alignment substrate stage in the alignment unit, wherein the aligning/leveling apparatus and the edge exposure apparatus are stacked vertically on opposite sides of a metro frame on the alignment substrate stage so as to perform the global aligning and leveling processes and the edge exposure process without moving the wafer on the alignment substrate stage.

11. The semiconductor photo equipment as claimed in claim 10, wherein the edge exposure apparatus further comprises:

a light intensity control unit for controlling an intensity of light projected onto the wafer; and a projection lens for projecting the light passing through the light intensity control unit onto the wafer.

12. The semiconductor photo equipment as claimed in claim 10, further comprising a common single light source to provide light to the exposure unit and the alignment unit.

13. The semiconductor photo equipment as claimed in claim 10, wherein the spinner apparatus does not include a wafer edge exposure unit.

14. A semiconductor manufacturing method using semiconductor photo equipment having a scanner apparatus and a spinner apparatus arranged to be inline with the scanner apparatus, the scanner apparatus including an alignment unit comprising an aligning/leveling apparatus and an edge exposure apparatus, and an exposure unit, the method comprising:

performing aligning and leveling processes for a first wafer on an alignment substrate stage in the alignment unit;

performing an wafer edge exposure process for the first wafer on the alignment substrate stage in the alignment unit; and performing a main exposure process for the first wafer in the exposure units, wherein the aligning/leveling apparatus and the edge exposure apparatus are stacked vertically on opposite sides of a metro frame on the alignment substrate stage, and wherein the aligning and leveling processes and the edge exposure process are performed without moving the first wafer on the alignment substrate stage.

15. The semiconductor manufacturing method as claimed in claim 14, wherein the main exposure process for the first wafer is performed after the edge exposure process for the first wafer.

16. The semiconductor manufacturing method as claimed in claim 14, further comprising performing the main exposure process for a second wafer in the exposure unit while performing the edge exposure process for the first wafer in the alignment unit.

17. The semiconductor manufacturing method as claimed in claim 16, further comprising performing the edge exposure process for the first wafer during a step process of the main exposure process for the second wafer.

18. The semiconductor manufacturing method as claimed in claim 17, wherein the method is applied to an OCS-type polysilicon storage node process.

19. The semiconductor manufacturing method as claimed in claim 14, wherein the edge exposure process and the main exposure process are performed using light from a common light source.

* * * * *